(12) United States Patent
Tanaka

(10) Patent No.: US 6,219,282 B1
(45) Date of Patent: Apr. 17, 2001

(54) FLASH EPROM HAVING MEANS FOR INCREASING THE RELIABILITY OF STORED DATA

(75) Inventor: Nobuhiko Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,658

(22) Filed: Nov. 16, 1999

(30) Foreign Application Priority Data

Jul. 8, 1999 (JP) ................................................ 11-194898

(51) Int. Cl.$^7$ .................................................. G11C 16/04
(52) U.S. Cl. ........................................ 365/185.33; 365/52
(58) Field of Search ................................ 365/49, 51, 52, 365/185.33, 196, 230.06, 207

(56) References Cited

U.S. PATENT DOCUMENTS

| | | | |
|---|---|---|---|
| 4,958,377 | * 9/1990 | Takahashi | 382/34 |
| 5,724,544 | * 3/1998 | Nishi | 395/442 |
| 5,742,843 | * 4/1998 | Koyanagi et al. | 395/800.14 |

FOREIGN PATENT DOCUMENTS 60-167051    8/1985   (JP) .

* cited by examiner

Primary Examiner—David Nelms
Assistant Examiner—Thong Le
(74) Attorney, Agent, or Firm—Burns, Doane, Swecker & Mathis, LLP

(57) ABSTRACT

The reliability of data read out from a flash EPROM is improved. The flash EPROM increases the reliability of stored data. A plurality of memory areas (1, 2, 3) includes a first memory (1) and a second memory area (2). Sense amplifiers (5-1, 5-2) are provided for the first and second memory areas (1, 2). A comparing device (6) is for comparing the data read out from the first and second memory areas (1, 2). A controlling device (9) selects either of the normal mode for independent utilization of the first and second memory areas (1, 2) and the high reliability mode for simultaneous utilization of the first and second memory areas (1, 2). In the high reliability mode, the controlling device (9) controls the first and second memory areas (1, 2) to store identical data, and controls the comparing device (6) a) to compare the data read out from the first and second memory areas (1, 2), and b) to output the data to the outer circuit, when the read out data are identical to each other.

8 Claims, 9 Drawing Sheets

FLASH EPROM HAVING MEANS FOR INCREASING THE RELIABILITY OF STORED DATA

TITLE OF THE INVENTION

A flash EPROM having means for increasing the reliability of stored data.

BACKGROUND OF THE INVENTION

1. Field of the Invention

The present invention relates to a flash EPROM, which can be rewritten electrically.

2. Description of the Prior Art

In the non-volatile memory semiconductor in the prior art, for example, a flash EPROM, it is reported that stored charges gradually discharge in a long time due to a minute defect in a memory cell. As a result, the stored data changes so that a data error occurs.

For avoiding the occurrence of such a data error, the non-volatile memory semiconductors in the prior art are screened before their shipment, and the reliability of data to be stored therein is guaranteed for a certain period of the utilization.

Some users, who use non-volatile memories, such as a flash EPROM, in a very hard condition, desire that data can be stored with high reliability at least in a certain memory area in the EPROM, and they admit the smallness of the memory size of such a high reliability memory area, if such reliability can be assured.

FIG. 10 is a block diagram of a flash EPROM in the prior art. The Flash EPROM comprises memory areas 101–103, a selector 104, a sense amplifier 105, and word line decoders 106–108 for each of the memory areas 101–103.

The function of the flash EPROM is explained below.

When the flash EPROM receives an address signal sent from an outer circuit, the word line decoders 106–108 decode the signal to select a word line, on the basis of the address signal.

The selector 104 selects a bit line. The data stored in the memory element at the crossing point of the bit line selected by the selector 104 and the word line selected by the word line decoders is read out by the sense amplifier 105 and is outputted to the outer circuit of the flash EPROM.

Each of the independent memory areas 101–103 in the non-volatile memory semiconductor in the prior art can independently write, store, and read data. However, means for verify whether the data read out from the memory areas 101–103 is correct or not is not equipped. Thus, there is a problem in the reliability of the read out data.

SUMMARY OF THE INVENTION

An object of the present invention is to eliminate the aforementioned problem.

Another object is to propose a flash memory having means for increasing the reliability of data read out from a memory element in the EPROM.

The objects are attained by a flash EPROM having means for increasing the reliability of read out data according to the present invention, comprising: a plurality of memory areas including a first and second memory area; sense amplifiers for the memory areas; a comparing means for comparing the data read out from the first and second memory areas; and a controlling means, which selects either of a normal mode for independent utilization of the first and second memory areas and a high reliability mode for simultaneous utilization of the first and second memory areas, wherein in the high reliability mode, the controller controls the first and second memory areas to store identical data, and controls the comparing means to compare the data read out from the first and second data areas, and to output the data to the outer circuit, when the read out data are identical to each other.

An embodiment of the flash EPROM of the present invention further comprises:

word line decoders, provided for each of the first and second memory areas, which decode address signals for selecting a memory element in each of the memory areas;

and a selector, provided for each of the first and second memory areas, which selects a bit line in each of the memory areas;

and said sense amplifier is provided for each of the first and second memory areas.

An embodiment of the flash EPROM of the present invention comprises a word line decoder provided commonly to the first and second memory areas, which decodes address signals for selecting a memory element in each of the memory areas, and said sense amplifier is provided commonly for the first and second memory areas.

In an embodiment of the flash EPROM of the present invention, when the result of the comparison in the comparing means, in the high reliability mode, indicates that the data read out from the first and second memory areas do not coincide to each other, the comparing means outputs an error information to an outer circuit, which indicates that the data read out from the first and second memory areas do no coincide to each other.

In an embodiment of the flash EPROM of the present invention, when the result of the comparison in the comparing means, in the high reliability mode, indicates that the data read out from the first and second memory areas do not coincide to each other, the comparing means inverts either of the data read out from the first or second memory areas and outputs the inverted value, as a stored data, to an outer circuit.

In an embodiment of the flash EPROM of the present invention, said sense amplifier is provided commonly for a plurality of memory areas including the first and second memory areas.

In an embodiment of the flash EPROM of the present invention, the sense amplifier is provided for each of the first and second memory areas, and the threshold value of the inverter in the sense amplifier for either of the first and second memory areas is set higher than that of the inverters of the sense amplifier for the other memory areas.

In an embodiment of the flash EPROM of the present invention, the comparing means compares the data obtained through a sense amplifier having a higher threshold value and the data obtained through the other sense amplifier, and the controlling means refreshes the data in memory elements in the first and second memory areas, when the data obtained from the first and second memory areas do not coincide to each other.

According to an embodiment of the present invention, in the high reliability mode, an important data, for example, a program data, is stored redundantly in the first and second memory areas in a plurality of memory areas of the flash EPROM. The data stored in the first and second memory areas are sensed by a set of word line decoder, a selector and a sense amplifier, provided for each of the first and second memory area, and a set of comparing circuit and a switching controlling circuit provided commonly to these memory areas. When the data read out from theses memory areas coincide to each other, the data is judged to be correct, and the data is outputted to an outer circuit. When the data do not coincide to each other, the inverse of the data read out from either of the first and second memory areas is outputted to the outer circuit.

Thus, advantages can be obtained in that the reliability of data stored in the memory areas can be estimated, and the reliability of data can be improved.

According to another embodiment, an important data, for example, a program data, is stored redundantly in the first and second memory areas in a plurality of memory areas of the flash EPROM. The data stored in the first and second memory areas are sensed by a word line decoder provided to each of the first and second memory area, and a set of a selector, a sense amplifier, a comparing circuit and a switching controlling circuit provided commonly to these memory areas. The data stored in the first and second memory areas are read out alternately. When the data read out from these memory areas coincide to each other, the data is judged to be correct, and the data is outputted to an outer circuit. When the data do not coincide to each other, the inverse of the data read out from either of the first and second memory areas is outputted to the outer circuit.

Thus, advantages can be obtained in that the reliability of data stored in the memory areas can be estimated, and the reliability of data can be improved. Furthermore, the hardware can be simplified.

According to another embodiment, the threshold value of the inverter in the sense amplifier for a memory area is set higher than that of the inverters in the sense amplifier for the other memory area so that deterioration of data in a memory element, i.e. a discharge in memory element, can be previously detected. And it is possible to refresh the data in the memory element, by rewriting the data, on the basis of the result of the detection. As a result, the level of data error detection can be set strict so that a high reliability flash EPROM can be obtained.

DETAILED DESCRIPTION OF THE PREFERRED EMBODIMENT

Embodiment 1

The flash EPROM having means for increasing the reliability of stored data according to the first embodiment is explained below, referring to FIGS. 1–4.

Figure 1:
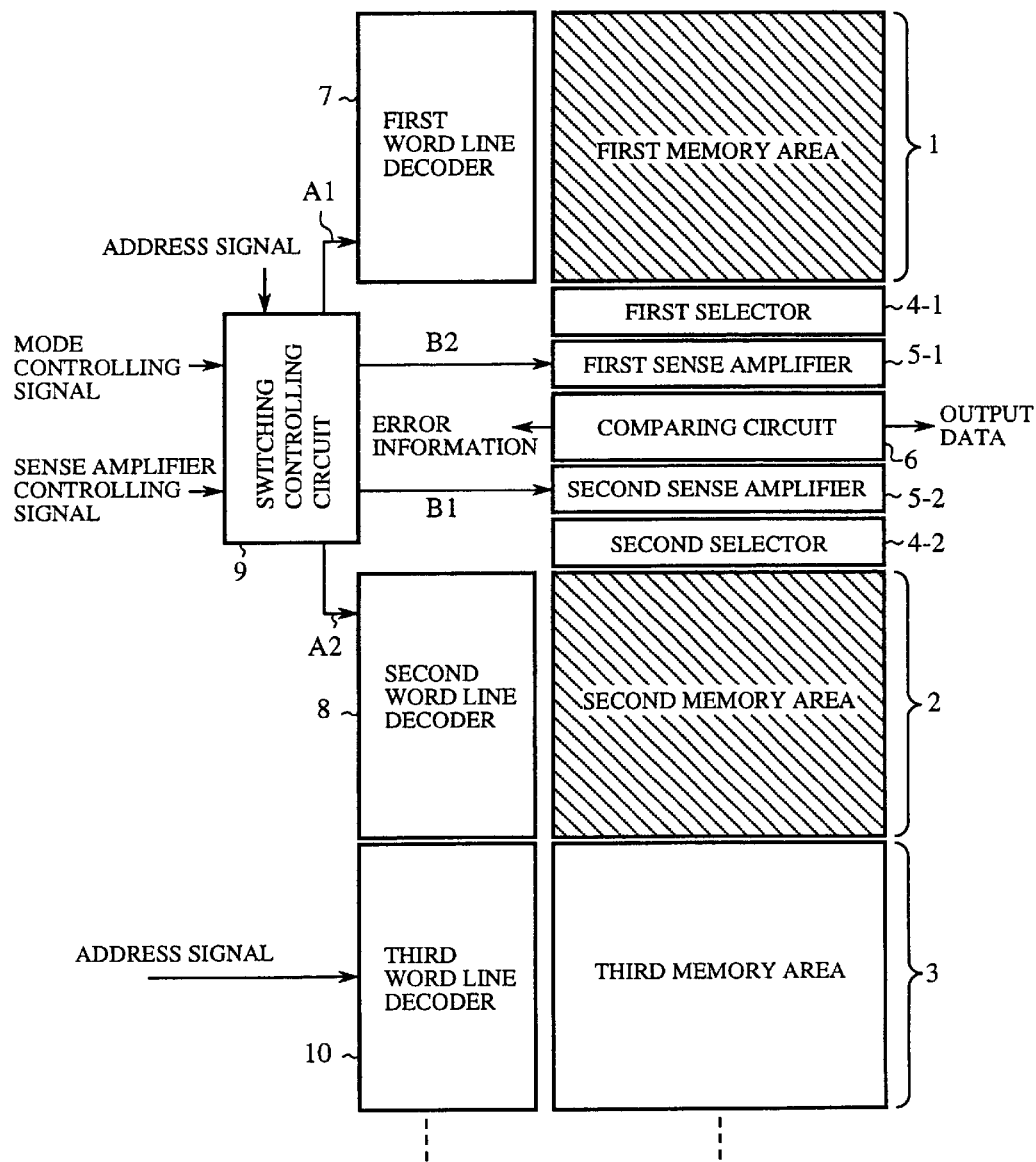
FIG. 1 is a block diagram of the flash EPROM having means for increasing the reliability of stored data according to the first embodiment of the present invention.

FIG. 1 shows a block diagram of an example of the flash EPROM having means for increasing the reliability of stored data according to the first embodiment of the present invention, comprising: a plurality of memory areas including a first memory 1, a second memory 2 and other memories 3; a first and second selectors 4-1 and 4-2 for selecting a bit line connected to a memory element in the first and second memory areas 1, 2, respectively; first and second sense amplifiers 5-1 and 5-2 for reading out data from the first and second memory areas 1, 2; a comparing circuit 6 (a comparing means) for comparing the data read out from the first and second memory areas 1, 2; a first and second word line decoders 7, 8 provided for each of the first and second memory areas 1, 2, respectively, each of which selects a word line in the first and second memory areas 1, 2; and a switching controlling circuit 9 (controlling means) for activating either of the first and second word line decoders 7, 8, on the basis of a mode controlling signal supplied from an outer circuit.

When an address signal is designating the first or second memory areas 1, 2, the signal is supplied to the switching controlling circuit 9. On the other hand, when the address signal is designating the other memory areas, for example, a memory area 3, the signal from an outer circuit, such as a CPU is directly supplied to another word line decoder 10.

Figure 2:
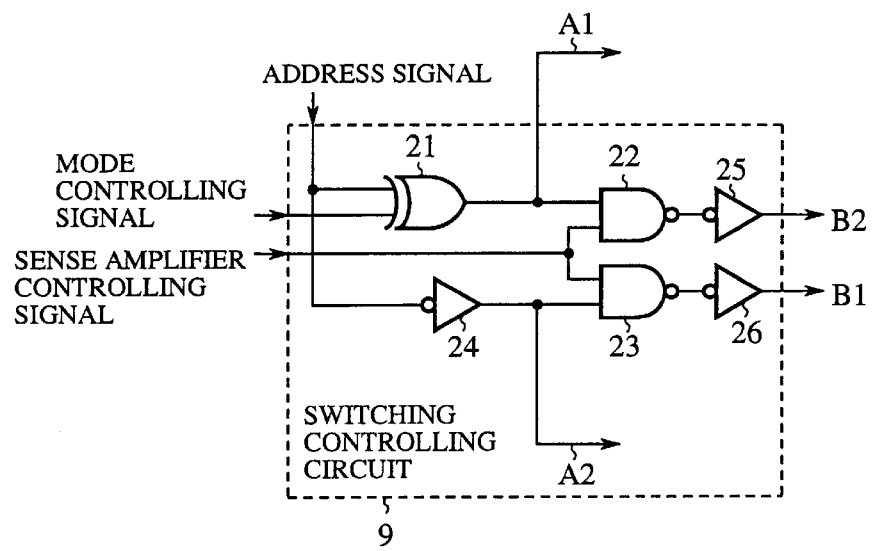
FIG. 2 is an example of the switching controlling circuit in the flash EPROM shown in FIG. 1.

The switching controlling circuit, included in the flash EPROM of FIG. 1, comprises a first EXOR element 21, NAND gates 22, 23, and inverters 24, 25, 26, as shown in FIG. 2. The first EXOR element 21 calculates the EXCLUSIVE OR of the address signal and the mode controlling signal.

Figure 3:
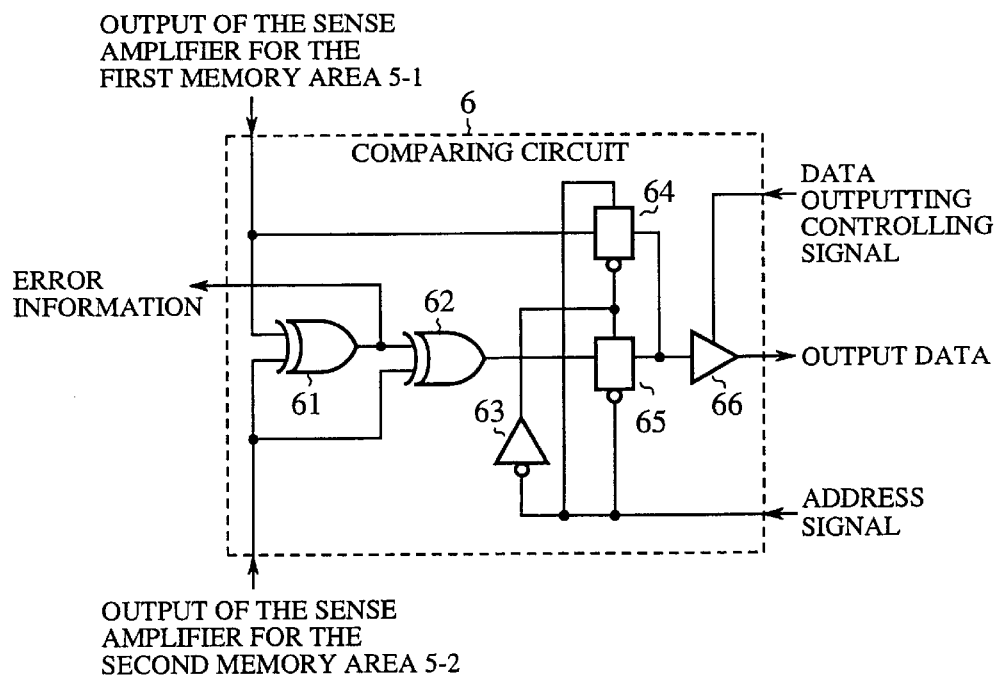
FIG. 3 is an example of the comparing circuit in the flash EPROM shown in FIG. 1.

The comparing circuit, included in the flash EPROM of FIG. 1, comprises a second and third EXOR elements 61, 62, inverters 63, transmission gates 64, 65 and a tristate buffer 66, as shown in FIG. 3.

Figure 4:
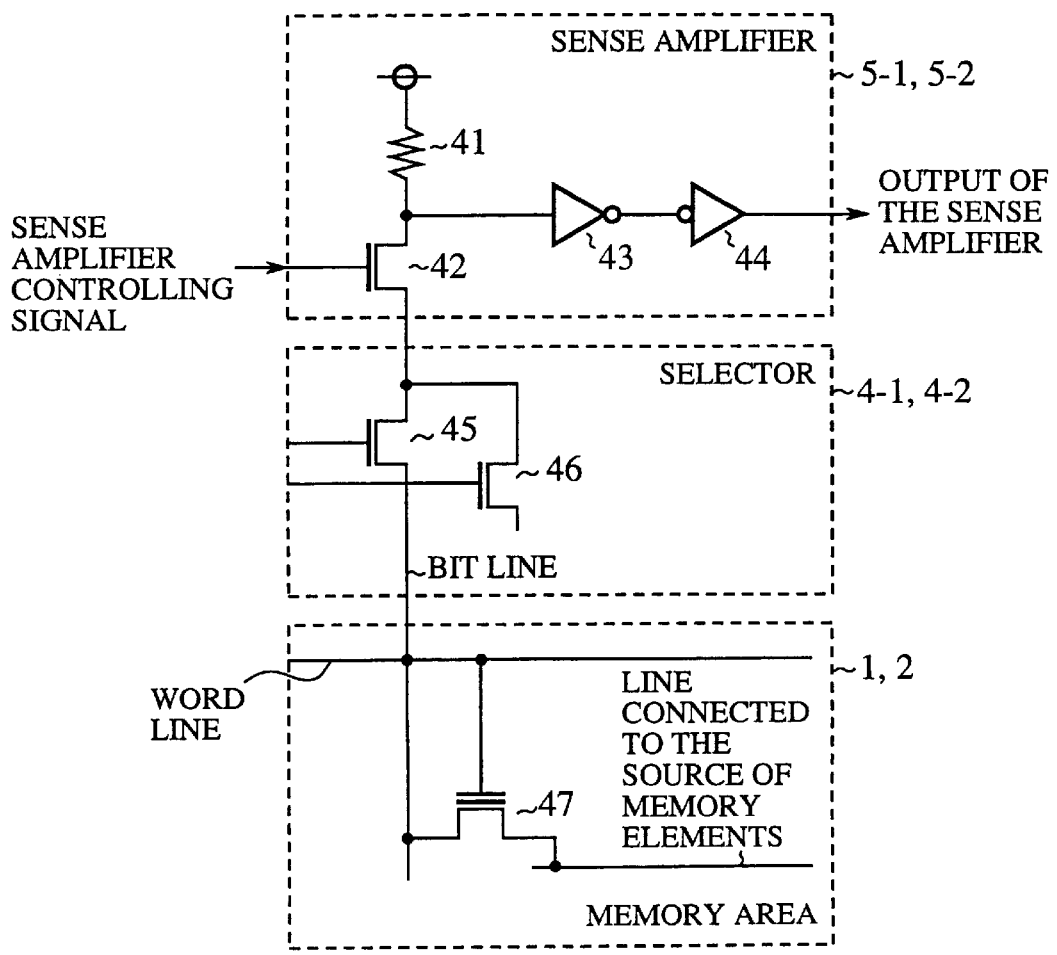
FIG. 4 is an example of the sense amplifier, a selector and a memory area in the flash EPROM shown in FIG. 1.

The first and second sense amplifiers 5-1, 5-2 included in the flash EPROM shown in FIG. 1 comprise a resistor 41, N type MOS transistor (hereinafter referred to NMOS) and inverters 43, 44, as shown in FIG. 4. Each of the first and second selectors 4-1, 4-2 comprises NMOSs 45, 46, and each of the first and second memory areas 1, 2 comprises memory elements 47.

The flash EPROM according to the first embodiment of the present invention comprises two memory areas 1, 2. In a normal mode, the first and second memory areas are used as ordinal memories, such as the other memory areas including the third memory area 3. And the memory areas 1, 2, and 3 can have a linear or continuous address.

When the inputted mode control signal is a signal for a high reliability mode, the EPROM is switched to a high reliability mode. In the high reliability mode, the data in the first and second memory areas are compared, and, when the data coincide to each other, the data is estimated to be correct and is outputted to an outer circuit.

The function of the first embodiment is explained below.

High Reliability Mode

An user program is stored in the first memory area 1. And the identical user program is stored also in the second memory area 2 of the flash EPROM, as shown in FIG. 1.

When the data stored in the memory area 2 is read out and sent to the outer circuit with high reliability, the CPU (not shown) generates a mode control signal at an "H" level and sends it to the switching control circuit 9.

When the switching controlling circuit 9 receives the mode control signal at an "H" level and an address signal at an "L" level selecting the second memory area 2, the first EXOR element 21 in the switching controlling circuit 9, shown in FIG. 2, outputs a signal A1 at an "H" level. This signal A1 is sent to the word line decoder 7 provided for the first memory area 1. Simultaneously, the address signal at an "L" level inputted to the inverter 24 in the switching controlling circuit 9 is inverted to a signal A2 at an "H" level. This signal A2 is sent to the word line decoder 8 provided for the second memory area 2. That is to say, both of the signals A1 and A2 are simultaneously in an "H" level. As a result, both of the word line decoders 7, 8 are activated, and one word line in each of the first and second memory areas 1, 2 is selected.

A memory element 47 in each of the memory areas 1, 2, which is positioned at a crossing point of the word line selected by the address signals A1, A2 and a bit line selected by the selectors 4-1, 4-2, is specified, as shown in FIG. 4. The data stored in the specified memory element 47 in each of the first and second memory areas are read out by the first and second sense amplifiers 5-1, 5-2, respectively.

Because, the first and second memory areas 1, 2 have an identical structure, the first and second sense amplifiers 5-1, 5-2 provided for each of them read out the data simultaneously.

The read out data in each of the first and second memory areas 1, 2 are sent to the second EXOR element 61 in the comparing circuit 6 so as to be checked whether they coincide or not.

For example, when the data read out from the first and second memory areas 1, 2 are identical to each other, the inputs to the second EXOR element 61 have an identical level, therefore, the output of the second EXOR element 61 is an "L" level. Conversely, when the output of the second EXOR element 61 is an "L" level, the data read out from the first and second memory areas 1, 2 are identical. And the comparing circuit 6 judges that the read out data are correct, and outputs the data read out from the secondary memory area 2 to an outer circuit out of the flash EPROM.

On the other hand, when the output of the second EXOR element 61 is an "H" level, the data read out from the first and second memory areas 1, 2 are not identical to each other, therefore, the comparing circuit 6 judges that the data read out is not correct. In this case, the output of the second EXOR element 61 at a "H" level is sent to the CPU (not shown) as an error signal indicating that the data read out from the second memory area 2 is not correct.

The data outputted from the second sense amplifier 5-2 provided for the second memory area 2 and the output signal of the second EXOR element 61 at an "H" level are inputted to the third EXOR element 62. The output signal of the third EXOR element 62 is outputted to an outer circuit out of the comparing circuit 6 through a transmission gate 65 and a tristate buffer 66, which is activated by a data control output signal sent from the CPU (not shown).

When high reliability of data is required, the aforementioned high reliability mode is selected. However, when such high reliability of data stored in a flash EPROM is not required, a normal mode is selected. In the normal mode, the CPU sets the mode control signal to an "L" level and sends it to the switching controlling circuit 9.

In the normal mode, the first and second memory areas 1, 2 function as two independent memory areas. The first and second memory areas 1, 2 can independently write and read data in a manner similar to the other ordinal memory areas such as a third memory area 3.

As explained above, when the flash EPROM according to the first embodiment of the present invention is used in the high reliability mode, an important data, such as a program data, is stored in two memory areas, for example, a first and second memory areas 1, 2, in a plurality of memory areas. And a first and second word line decoders 7, 8, a first and second selectors 4-1, 4-2, and first and second sense amplifiers 5-1, 5-2, are provided for each of the first and second memory areas 1, 2. Further, a comparing circuit 6 and switching controlling circuit 9 are provided for a set of the memory areas 1, 2. And the data read out from the first and second memory areas 1, 2 are compared by the comparing circuit 6 and the switching controlling circuit 9.

When the data read out from the first and second memory areas coincide to each other, the read out data is judged to be correct and its outputted to an outer circuit.

On the other hand, when the data do not coincide to each other, the inverse of the data read out from either of the first or second memory, for example, the second memory area 2, is outputted to an outer circuit.

Therefore, an advantage can be obtained in that the reliability of the data stored in the memory areas can be estimated, so that the reliability of the data can be augmented.

Embodiment 2

The flash EPROM having means for increasing the reliability of stored data according to the second embodiment of the present invention is explained below, referring to FIGS. 5–8.

The flash EPROM having means for increasing the reliability of stored data according to the second embodiment of the present invention comprises: a first, second and third memory areas 1, 2, 3; a selector 54 for selecting a bit line connected to a memory element in the first and second memory areas 1, 2; a sense amplifier 55 for reading out the data stored in a memory element; a comparing circuit (comparing means) 56 for comparing the outputs read out at the first and second steps by the sense amplifier 55; a first and second word decoders 57, 58, provided respectively for the first and second memory areas 1, 2, for selecting a word line in the first and second memory areas 1, 2; and a switching controlling circuit (controlling means) 59 for actuating either of the word line decoders 57, 58, corresponding to a mode controlling signal sent from an outer circuit.

When an address signal is designating a memory element in the first and second memory areas, the address signal is sent to the switching controlling circuit 59, on the other hand, when the address signal is designating a memory element in another memory area, for example, the memory area 3 other than the first and second memory areas 1, 2, the address signal is sent directly to a word line decoder 60.

Figure 5:
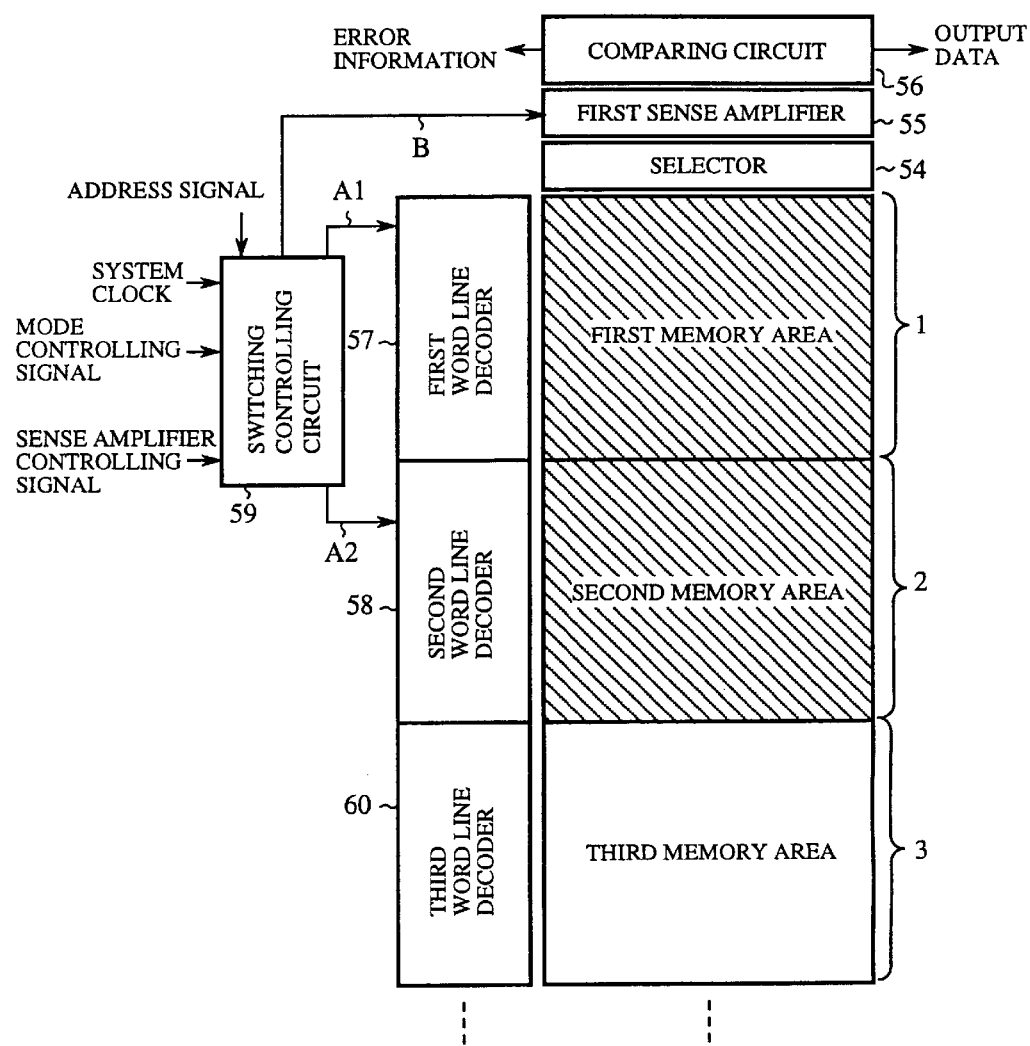
FIG. 5 is a block diagram of the flash EPROM having means for increasing the reliability of stored data according to the second embodiment of the present invention.
Figure 6:
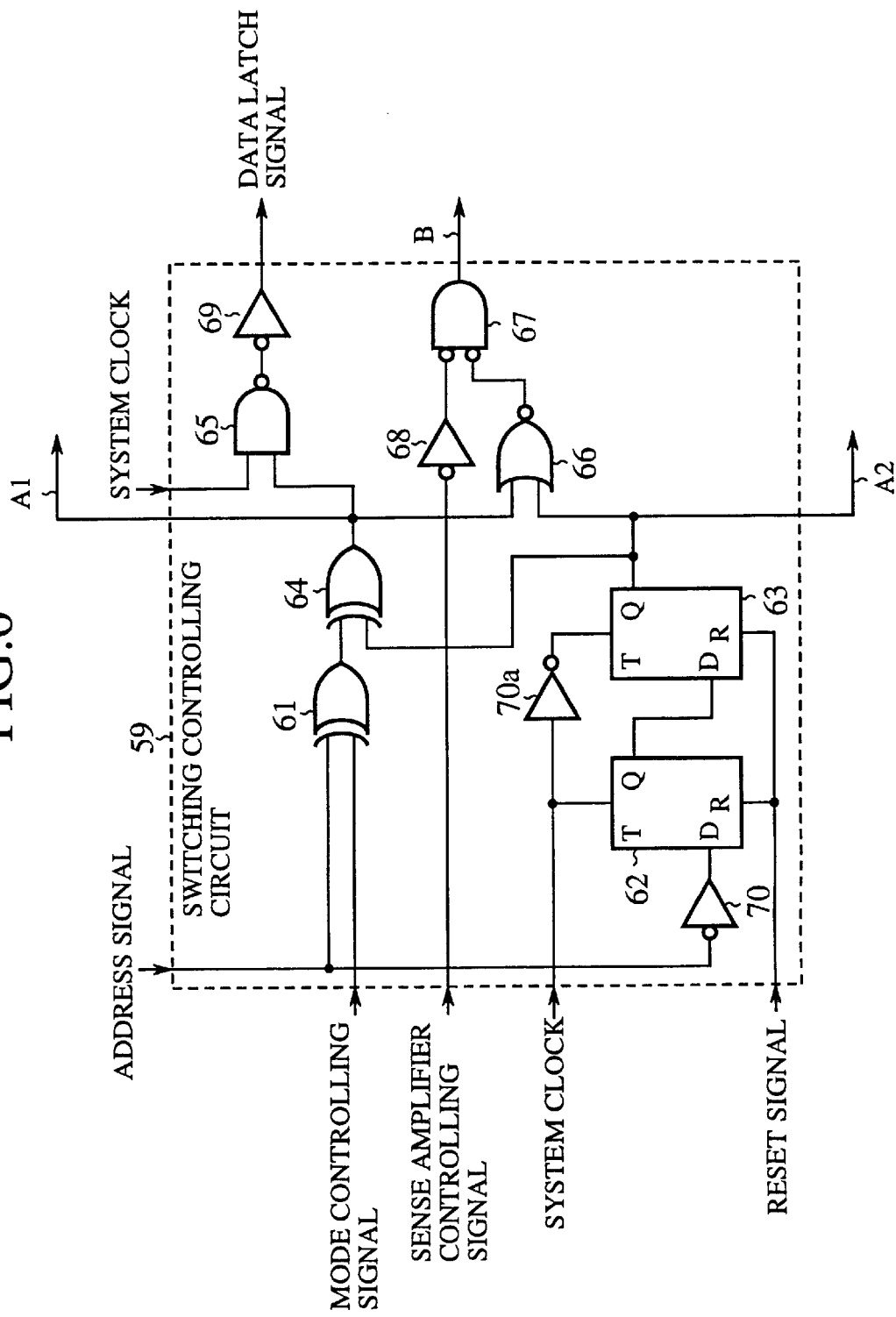
FIG. 6 is an example of the switching controlling circuit in the flash EPROM shown in FIG. 5.

The switching controlling circuit 59 in the flash EPROM shown in FIG. 5 comprises: a second EXOR element 61, a first and second latch circuits 62, 63, a fourth EXOR element 64, a NAND element 65, a NOR element 66, 67, and inverters 68, 69, 70, 70a. The inputs of the second EXOR element 61 are address signal and the mode controlling signal, and the inputs of the fourth EXOR element 64 are the output of the fourth EXOR element 61 and the output of the latch circuit 63, as shown in FIG. 6.

Figure 7:
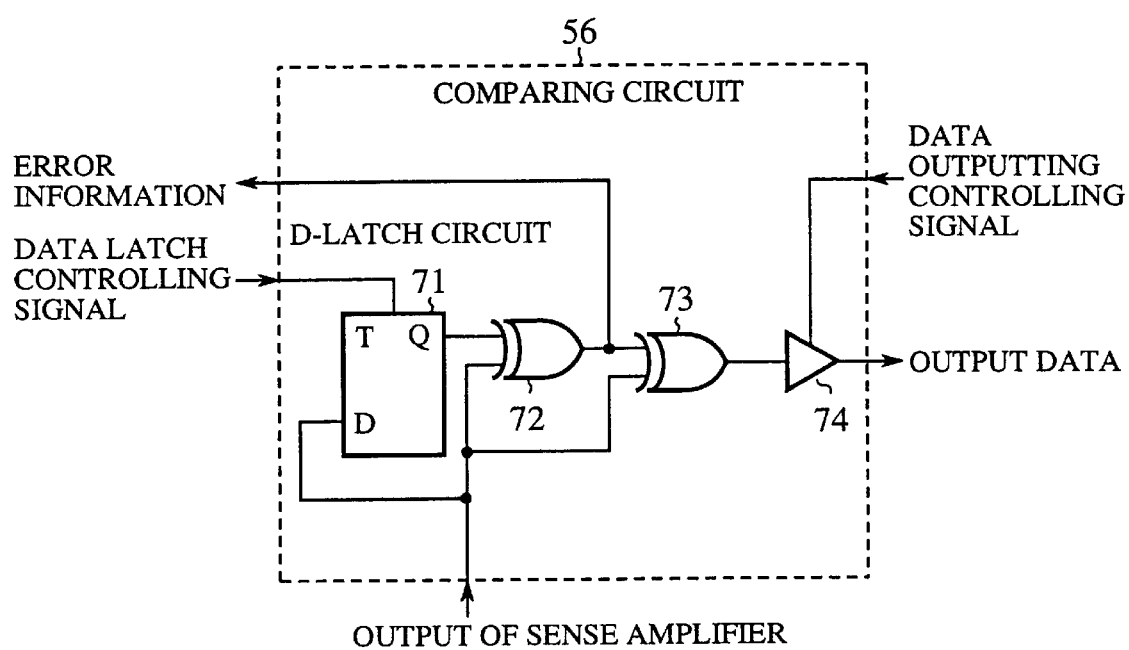
FIG. 7 is an example of the comparing circuit in the flash EPROM shown in FIG. 5.

The comparing circuit 56 in the flash EPROM shown in FIG. 5 comprises: a latch circuit 71, a fifth and sixth EXOR elements 72, 73 and a tristate buffer 74, as shown in FIG. 7.

As explained above, the flash EPROM according to the first embodiment of the present invention comprises two sense amplifiers 5-1, 5-2 for reading out the data stored in the first and second memory areas 1, 2. On the other hand, the flash EPROM according to the second embodiment of the present invention comprises only one sense amplifier 55.

At the first step, the data stored in the first memory area 1 is read out and is temporarily stored in the latch circuit 71 in the comparing circuit 56. In the next step, the data stored in the second memory area 2 is read out and is compared with the data stored in the latch circuit 71 so as to estimate whether both of the data coincide to each other. When the data coincide to each other, the data stored in the memory areas is judged to be correct and is outputted to an outer circuit.

When the flash EPROM according to the second embodiment is used in a normal mode, the first and second memory areas 1, 2 are used as an independent memory areas. And all the memory areas including the third memory area 3 and the other memory areas (not shown) are used as a single memory area having a linear or continuous memory address.

The mode is controlled by a mode controlling signal. And when a high reliability mode is selected by the mode controlling signal, the flash EPROM is switched to the high reliability mode by the switching controlling circuit 59.

In the high reliability mode, data stored in the first and second memory areas 1, 2 are sensed and are compared to each other. When both of the data coincide to each other, the data is judged to be correct and is outputted to an outer circuit.

The function of the flash EPROM according to the second embodiment of the present invention is explained below.

Figure 8A:
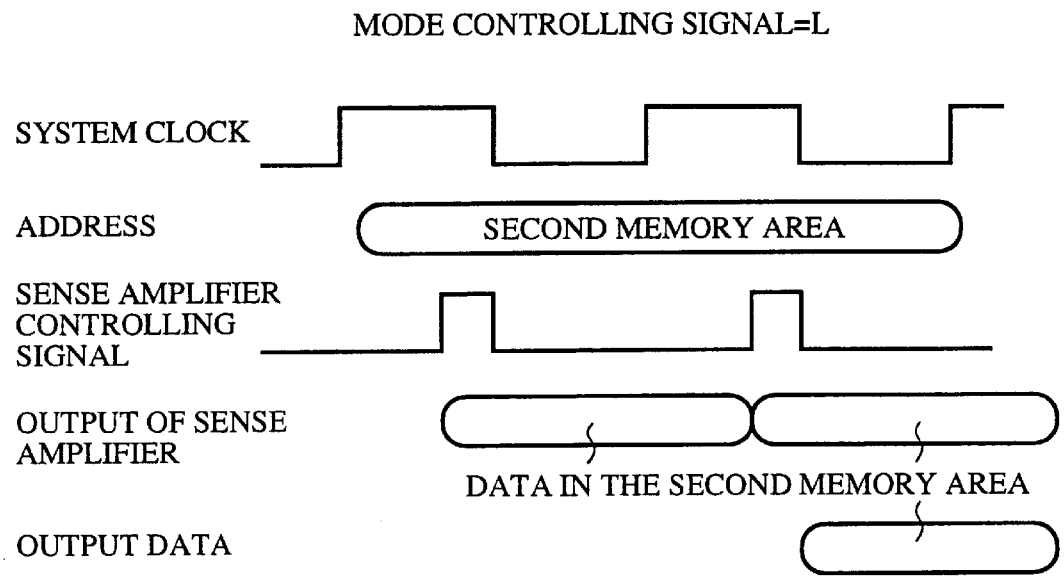
FIG. 8 is a timing chart of the signals in the flash EPROM according to the second embodiment of the present invention.
Figure 8B:
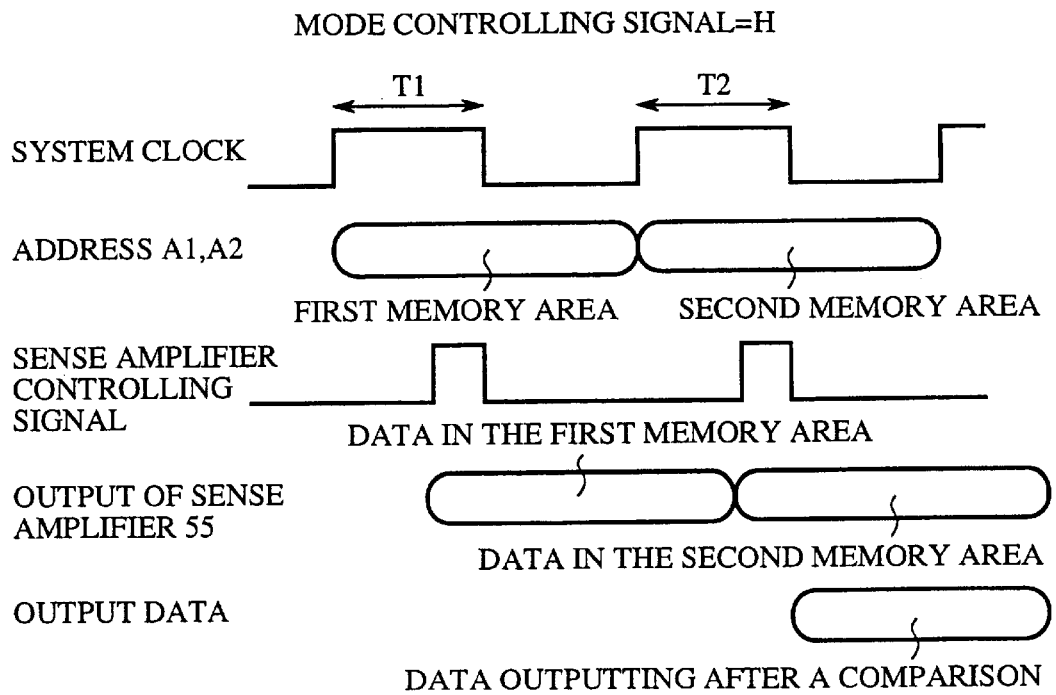

FIG. 8 is a timing chart of the signals in the flash EPROM according to the second embodiment of the present invention, shown in FIGS. 5–7.

The flash EPROM can function in the normal mode or in the high reliability mode. The mode can be selected, corresponding to whether the mode controlling signal is an "L" or "H" level. Timing charts of signals at the reading out of data in the normal mode and in the high reliability monde are shown, respectively, in FIG. 8(a) and (b).

In the normal mode, as shown in FIG. 8(a), an address signal is inputted, while the system clock is an "H" level. And a data is read out from a memory area, while the sense amplifier controlling signal is an "H" level. The data read out from the memory area 1-3 is outputted to an outer circuit, while the system clock is an "L" level. In the normal mode, the first to third memory areas function independently, that is to say, data can be inputted in and outputted from these memory areas independently.

When high reliability of data stored in the memory areas is required, the mode controlling signal is set to an "H" level by a CPU (not shown), and the signal is sent to the switching controlling circuit 59 so that the flash EPROM functions in the high reliability mode.

When the mode controlling signal inputted to the switching controlling circuit 59 from the CPU is an "H" level, the first latch circuit 62 in the switching controlling circuit 59 acquires and stores the address signal, during the first "H" level period T1 of the system clock, which is supplied from an outer circuit. And the data stored in the first latch circuit 62 is sent to the second latch circuit 63, during the second "H" level period T2 of the system clock. In this manner, the second latch circuit 63 acquires and stores the inputted address data.

The output of the second latch circuit 63 is an "L" level during the first "H" level period T1. Therefore, when the address signal for selecting the second memory area 2 is an "L" level signal, the output A1 of fourth EXOR element 64 is an "H" level. That is to say, a word line in the first memory area 1 is selected.

The data stored in the memory element located at the crossing point of the selected word line in the first memory area 1 and the bit line selected by the selector 54 is sensed by the sense amplifier 55 and is sent to the comparing circuit 56.

In the comparing circuit 56, the latch circuit 71 acquires the output data of the sense amplifier 55, while the data latch control signal is an "H" level.

During the second "H" level period of the system clock, the output A2 of the latch circuit 63 in the switching control circuit 59 changes to an "H" level. On the other hand, the output A1 of the fourth EXOR element 64 changes to an "L" level. Therefore, a word line in the second memory area 2 is selected. The data stored in the memory element located at the crossing point of the selected word line in the second memory area 2 and the bit line selected by the selector 54 is sensed by the sense amplifier 55 and is sent to the comparing circuit 56.

In the comparing circuit 56, the fifth EXOR element 72 compares the data sent from the sense amplifier 55 and the data stored in the latch circuit 71. When both the data coincide to each other, the data stored in the second memory area 2 is judged to be correct, and the data read out from the second memory area 2 is outputted to an outer circuit of the flash EPROM, after passing the sixth EXOR element 73.

When both the data do not coincide to each other, the data are judged to be false. And the data read out from either of the memory areas, for example, the data from the second memory area 2 is inverted by the sixth EXOR element 73, the inverted data is judged to be correct, and is outputted to an outer circuit. In such a case, the fifth EXOR element 72 outputs error information to the CPU. The error information indicates that the data read out from the second memory area 2 can be false.

As explained above, in the second embodiment of the present invention, an important data, for example, a program data, is stored redundantly in the first and second memory areas 1, 2 in a plurality of memory areas of a flash EPROM. The data stored in these first and second memory areas are read out alternately, using word line decoders 57, 58 for each of the first and second memory areas 1, 2, a selector 54, a sense amplifier 65, a comparing circuit 56, and a switching controlling circuit. The data read out from the first and second memory are compared whether they coincide to each other. When they coincide to each other, the read out data is outputted to an outer circuit, and when they do not coincide, the inverse of the data read out from either of the first and second memory areas is outputted to an outer circuit.

Thus, advantages can be obtained in that the reliability of the data stored in the memory areas can be estimated so that the reliability of the data can be increased, and that the construction of the hardware can be simplified compared to the first embodiment.

Embodiment 3

The flash EPROM having means for increasing the reliability of stored data according to the third embodiment of the present invention is explained below, referring to FIG. 9, which shows memory areas, a sense amplifier and a comparing circuit.

Reference number 95-1 denotes a first sense amplifier for the first memory area 1. The sense amplifier comprises an inverter 93 having a threshold value higher than that of the other inverters 43, 44.

Reference numeral 5-2 denotes a second sense amplifier for the second memory area 2. The structure of the second sense amplifier 5-2 is identical to that used in flash EPROM according to the first embodiment of the present invention. The other components of the flash EPROM according to the third embodiment identical or similar to those of the flash EPROM according to the first embodiment shown in FIGS. 1–4, are referred by the same reference numerals. And their explanation is omitted.

The function of the flash EPROM according to the third embodiment is explained below.

The threshold value of the inverter 93 in the first sense amplifier 5-1 for the first memory area 1 is designed to be higher than that of the other inverter 44 in the first sense amplifier 5-1, and the inverters 43, 44 in the second sense amplifier 5-2, so that the error detection level for the data stored in memory elements in the first memory area 1 is strict than that of the other memory areas.

Before the data stored in the second memory area 2 changes to be erroneous, the stored data can be refreshed by rewriting the data, on the basis of the error information obtained from the flash EPROM according to the third embodiment of the present invention. Therefore the reliability of the data stored in the memory areas can be improved.

Figure 9:
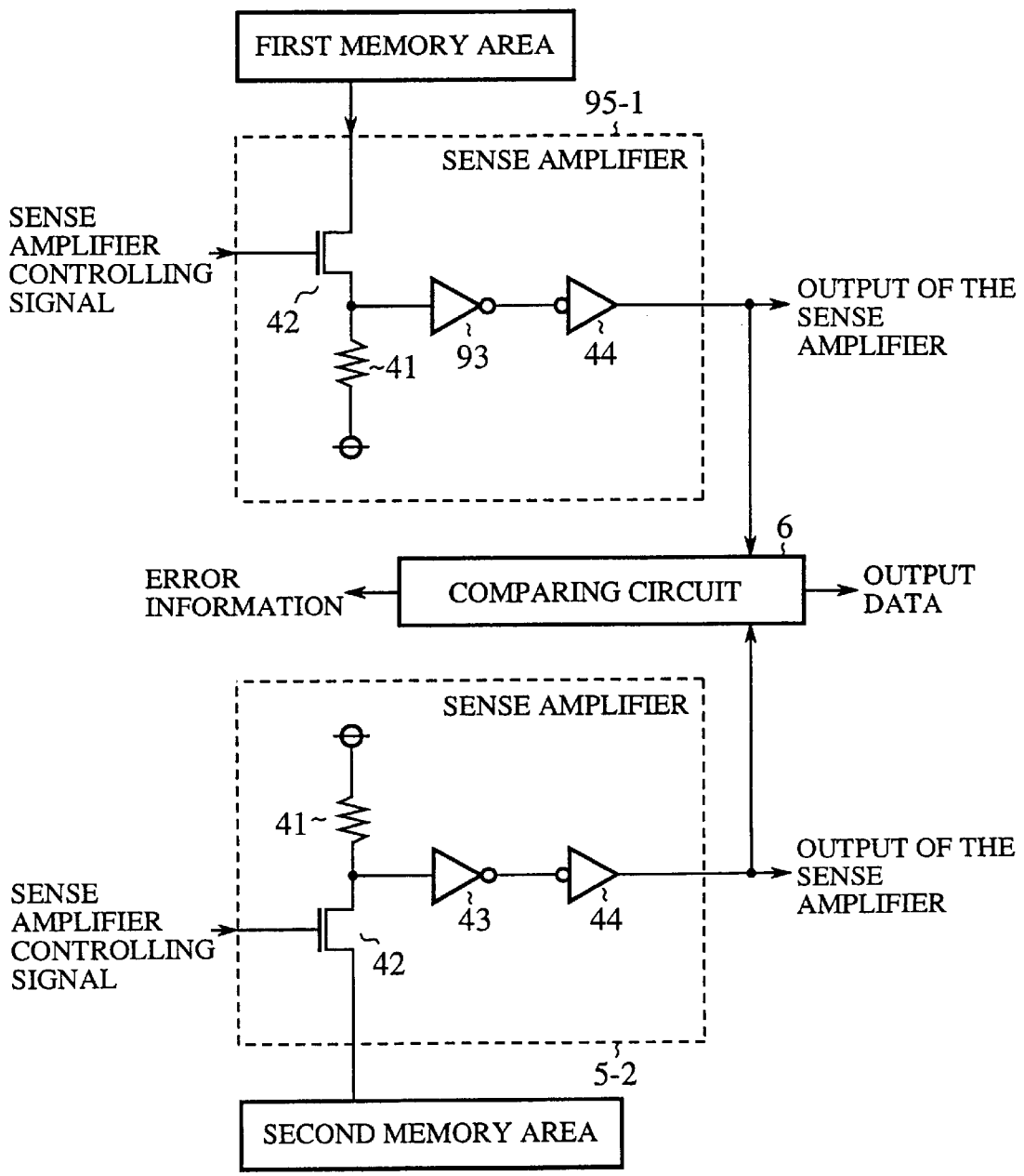
FIG. 9 is an example of the memory area, the sense amplifier, and a selector in the flash EPROM according to the third embodiment of the present invention.
Figure 10:
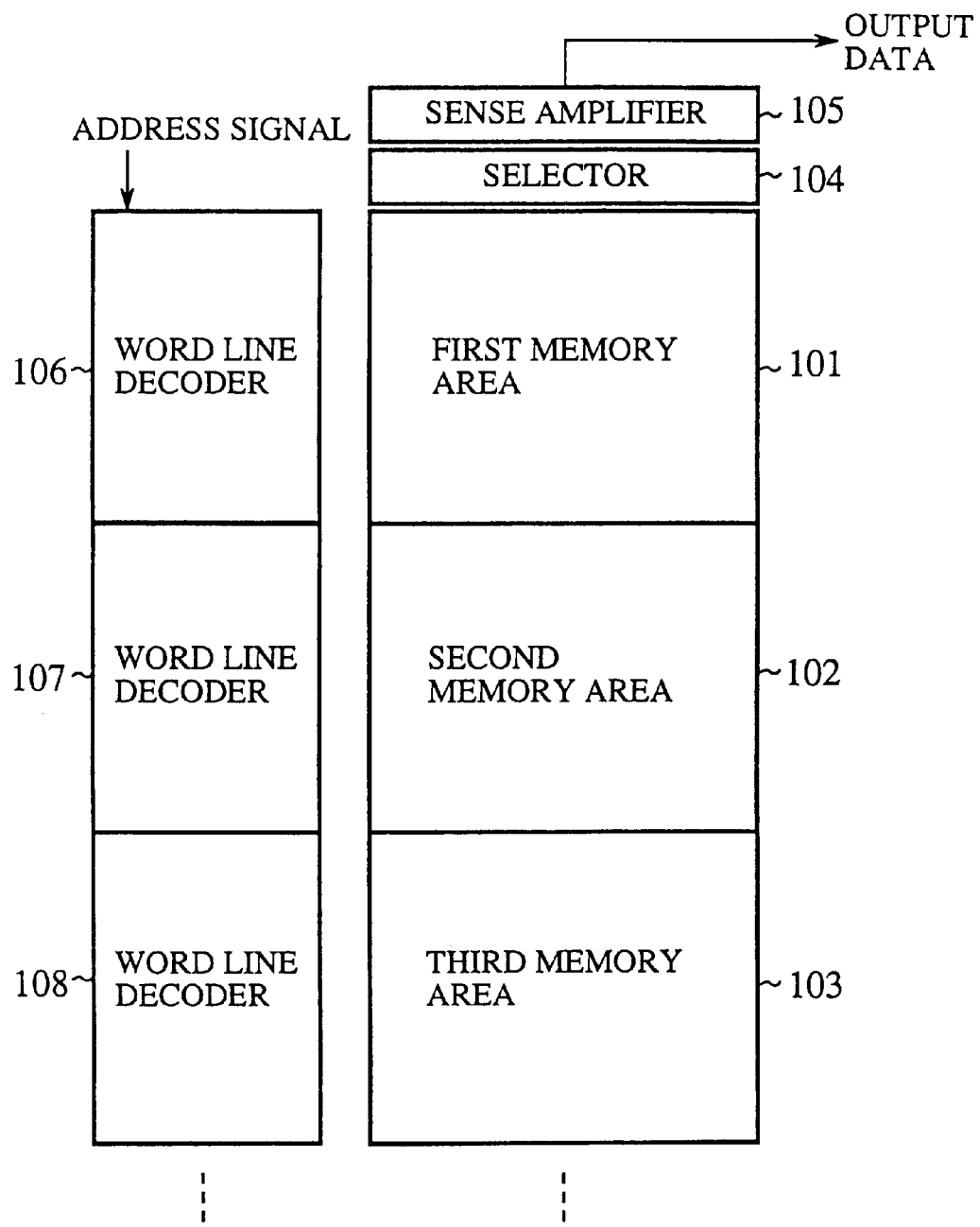
FIG. 10 is a block diagram of the non-volatile memory semiconductor in the prior art.

The structures of the first sense amplifier 95-1 shown in FIG. 9 is basically identical to that of the sense amplifiers 5-1, 5-2 shown in the flash EPROM according to the first embodiment of the present invention, expecting only that the threshold value of the inverter 93 is higher than that of the other inverters 43, 44.

As explained above, in the flash EPROM according to the third embodiment of the present invention, the threshold value of the inverter in the sense amplifier 95-1 for the first memory area 1 is set higher than that of the other inverters. Thus the refreshing of data, i.e., data rewriting, is possible, before the discharge of the memory element takes place. That is to say, the errors in data can be strictly detected, therefore a high reliability EPROM can be obtained.

What is claimed is:

1. A flash EPROM having means for increasing the reliability of stored data comprising:

a plurality of memory areas including a first memory area and a second memory area;

sense amplifiers provided for the first and second memory areas;

a comparing means for comparing the data read out from the first and second memory area; and a controlling means, which selects either of a normal mode for independent utilization of the first and second memory areas and a high reliability mode for simultaneous utilization of the first and second memory areas, wherein in the high reliability mode, the controlling means controls the first and second memory areas to store identical data, and controls the comparing means to compare the data read out from the first and second memory areas, and to output the data to an outer circuit, when the read out data are identical to each other.

2. The flash EPROM having means for increasing the reliability of stored data according to claim 1, further comprising:

word line decoders provided for each of the first and second memory areas, which decode address signals for selecting a memory element in each of the first and second memory areas;

and a selector provided for each of the first and second memory areas, which selects a bit line in each of the memory areas;

and said sense amplifier is provided for each of the first and second memory areas.

3. The flash EPROM having means for increasing the reliability of stored data according to claim 1, further comprising a word line decoder, provided commonly for the first and second memory areas, which decodes address signals for selecting a memory element in each of the memory areas, said sense amplifier is provided commonly for the first and second memory areas.

4. The flash EPROM having means for increasing the reliability of stored data according to claim 1, wherein in the high reliability mode, when the result of the comparison in the comparing means indicates that the data read out from the first and second memory areas do not coincide to each other, the comparing means outputs error information to an outer circuit, which indicates that the data do no coincide to each other.

5. The flash EPROM having means for increasing the reliability of stored data according to claim 1, wherein in the high reliability mode, when the result of the comparison in the comparing means indicates that the data read out from the first and second memory areas do not coincide to each other, the comparing means inverts either of the data read out from the first or second memory areas and outputs the inverted value to an outer circuit.

6. The flash EPROM having means for increasing the reliability of stored data according to claim 1, wherein said sense amplifier is provided commonly for a plurality of memory areas including the first and second memory areas.

7. The flash EPROM having means for increasing the reliability of stored data according to claim 1, wherein the sense amplifier is provided for each of the first and second memory areas, and a threshold value of an inverter in one of the sense amplifiers for the first and second memory areas is set higher than that of an inverter for the other of the sense amplifiers.

8. The flash EPROM having means for increasing the reliability of stored data according to claim 7, wherein the comparing means compares the data obtained through a sense amplifier having a higher threshold value and the data obtained through the other sense amplifier, the controlling means refreshes the data in memory elements in the first and second memory areas, when the data from the first and second memory area do not coincide with each other.

\* \* \* \* \*